(12) United States Patent
Hehn

(10) Patent No.: US 7,075,464 B2
(45) Date of Patent: Jul. 11, 2006

(54) CIRCUIT FOR CURRENT MEASUREMENT AND CURRENT MONITORING

(75) Inventor: Lars Hehn, Heilbronn (DE)

(73) Assignee: Atmel Germany GmbH, Heilbronn (DE)

( * ) Notice: Subject to any disclaimer, the term of this patent is extended or adjusted under 35 U.S.C. 154(b) by 0 days.

(21) Appl. No.: 11/137,463

(22) Filed: May 26, 2005

(65) Prior Publication Data

US 2005/0270198 A1    Dec. 8, 2005

(30) Foreign Application Priority Data

May 27, 2004   (DE)   ............... 10 2004 026 537
Jul. 27, 2004   (DE)   ............... 10 2004 036 352

(51) Int. Cl.
*H03M 1/06* (2006.01)

(52) U.S. Cl. ....................... 341/118; 341/120

(58) Field of Classification Search ............... 341/118, 341/120, 139, 155; 324/127, 132, 151, 152, 324/128, 134
See application file for complete search history.

(56) References Cited

U.S. PATENT DOCUMENTS

| | | | | |
|---|---|---|---|---|
| 3,978,402 A | * | 8/1976 | Ryder | ............... 324/607 |
| 4,097,860 A | * | 6/1978 | Araseki et al. | ............... 341/118 |
| 4,217,543 A | * | 8/1980 | Strong | ............... 324/710 |
| 4,408,123 A | * | 10/1983 | Sichling et al. | ............... 250/226 |
| 4,529,965 A | * | 7/1985 | Lee | ............... 341/122 |
| 4,815,763 A | * | 3/1989 | Hartmann | ............... 280/276 |
| 4,999,632 A | * | 3/1991 | Parks | ............... 341/167 |
| 5,194,868 A | * | 3/1993 | Bahng et al. | ............... 341/167 |
| 5,519,352 A | * | 5/1996 | Mo | ............... 327/345 |
| 5,920,189 A | | 7/1999 | Fisher et al. | |
| 5,920,273 A | * | 7/1999 | Hirano | ............... 341/144 |
| 6,243,034 B1 | * | 6/2001 | Regier | ............... 341/166 |
| 6,335,611 B1 | | 1/2002 | Sasaki | |
| 2002/0180418 A1 | | 12/2002 | Jones et al. | |

FOREIGN PATENT DOCUMENTS

DE   3700987   7/1988

* cited by examiner

*Primary Examiner*—Linh V. Nguyen
(74) *Attorney, Agent, or Firm*—McGrath & Geissler, PLLC

(57) ABSTRACT

A circuit for current measurement and current monitoring in a motor vehicle is provided, with a measuring circuit with a first subtractor circuit, connected to a measuring resistor; an offset circuit, which is connected to the first subtractor circuit in such a way that a first output voltage of the first subtractor circuit is increased by an offset voltage; a second subtractor circuit, which is connected to the offset circuit and the first subtractor circuit in such a way that a second output voltage of the second subtractor circuit is substantially independent of the offset voltage, and a comparator circuit with at least one switching threshold, which is connected to the second subtractor circuit for comparison of the second output voltage with the at least one switching threshold.

15 Claims, 2 Drawing Sheets

CIRCUIT FOR CURRENT MEASUREMENT AND CURRENT MONITORING

This nonprovisional application claims priority under 35 U.S.C. § 119(a) on German Patent Application No. DE 102004026537.2, which was filed in Germany on May 27, 2004, and on German Patent Application No. DE 102004036352.8, which was filed in Germany on Jul. 27, 2005, both of which are herein incorporated by reference.

BACKGROUND OF THE INVENTION

1. Field of the Invention

The present invention relates to a circuit for current measurement and current monitoring and the use thereof for, for example, a functional unit of a motor vehicle.

2. Description of the Background Art

Conventionally, an operational amplifier is wired as a subtractor circuit, so that a first input potential of a negative input of the subtractor circuit is subtracted from a second input potential of a positive input of the subtractor circuit. Also, an offset voltage can be set by connecting the subtractor circuit to a certain potential. The effect of the offset voltage is that the output voltage of the subtractor circuit is the sum of the offset voltage and the differential voltage between the first and the second input potential. For current measurement, the first input and the second input are each connected to at least one contact of a measuring resistor.

DE 37 00 987 C2 discloses a device for the determination of electric voltage for processing by a microcomputer. The device is equipped with at least one analog/digital converter, which has a conversion width of n bits. The device is equipped with a digital/analog converter and a differential amplifier, which amplifies the difference between the voltage to be measured and the output signal of the digital/analog converter and supplies it to the at least one analog/digital converter of the microcomputer.

The microcomputer comprises means which control the conversion of, or one of the analog/digital converters into a first digital word and which provide the highest value bit of this word via the digital/analog converter to the differential amplifier. Moreover, the means control the conversion of the amplified difference between the voltage to be measured and the output signal of the digital/analog converter by means of, or one of the analog/digital converters into a second digital word. Moreover, from the first and second digital word, the means form a digital result, m+n bit wide, representing the voltage to be measured, so that the resolution of the measured voltage is m+n bits, where m<n. The amplification of the differential amplifier is $k=2^m$. The digital/analog converter has a word width of m+1 bits. The microcomputer comprises means, which form a hysteresis during the transition from one lower measuring range, designated by the highest value bit of the converted voltage, to another.

SUMMARY OF THE INVENTION

It is therefore an object of the present invention to provide a circuit, which develops further the determination of electrical values and is suitable for both current measurement and current monitoring.

The circuit of the present invention for current measurement and current monitoring can have several subcircuits. The first subcircuit can be a measuring circuit with a first subtractor circuit, which is connected to a measuring resistor. The second subcircuit can be an offset circuit, which is connected to the first subtractor circuit in such a way that a first output voltage of the first subtractor circuit is increased by an offset voltage. This output voltage of the first subtractor circuit can be set by the offset voltage to operate preferably an evaluation circuit, connected to the output of the first subtractor circuit, at an optimal operating point in regard to its input signal range. If the evaluation circuit, for example, has an analog/digital converter, the converter can be operated only with input voltages that can be converted to digital information.

The third subcircuit can be a second subtractor circuit, which is connected to the offset circuit and the first subtractor circuit in such a way that a second output voltage of the second subtractor circuit is substantially independent of the offset voltage. The fourth subcircuit can be a comparator circuit with at least one switching threshold, which is connected to the second subtractor circuit for comparison of the second output voltage with the at least one switching threshold. The comparator circuit enables a rapid evaluation independent of the design of evaluation circuit connected to the first subtractor circuit. As a result, the monitoring and measurement of the current can occur separately by separate evaluation by the comparator circuit and/or by the evaluation circuit. The monitoring by the comparator circuit thereby occurs independent of the offset voltage.

This is advantageous especially in regard to an example embodiment of the invention, in which the offset circuit is designed so that the offset voltage can be set. In this case, the setting of the offset voltage for optimizing the input voltage of the evaluation circuit is independent of the monitoring of the current by the comparator circuit. This is particularly advantageous when the current is to be monitored, preferably, continuously at any time also, for example, during continuous variation of the offset voltage.

In addition to a possible continuous setting of the offset voltage, an advantageous embodiment of the invention provides for the offset circuit for setting the offset voltage to have a voltage divider, particularly with switchable resistors. Switchable resistors are taken to mean several resistors each with a switch, connected in series or parallel, preferably a MOSFET transistor. A total resistance can be set from several individual resistors by the switches. Thus, for example, a resistor of the voltage divider can include several individual resistors, which are connected in parallel to each other and are each activated by a transistor.

The measuring circuit can be designed for bidirectional current measurement. Therefore, both current directions, flowing across the measuring resistor, can be both measured and monitored. Another switching threshold of the comparator circuit makes it possible to monitor negative output voltages of the first subtractor circuit.

The measuring circuit can also be designed such that an amplification of the first subtractor circuit can be set. A settability is preferably controlled by an arithmetic and control unit, which adjusts the sensitivity of the measuring circuit by setting the amplification as a function of the expected or predefined measuring range.

Also, to set the amplification, the resistors of the first subtractor circuit can be switchable. In this case as well, several resistors can be connected in parallel, each with a series switching transistor. Alternatively, the resistors can also be connected in series, each with a parallel switching transistor.

To enable monitoring of the measuring current within a desired set range, the comparator circuit preferably can have a window discriminator.

Further, the measuring circuit, the offset circuit, the second subtractor circuit, and the comparator circuit can be integrated on a single semiconductor chip. Together with an arithmetic unit, particularly a microcontroller, these can be designed as intelligent power electronics.

A preferred use of the circuit for current measurement and current monitoring of a load current of a load is, for example, in a functional unit of a motor vehicle. The use for vehicle electronics has the distinctive feature that the monitoring of the current is still fully functional even when the current measurement is no longer possible due to an electrical fault or program error in evaluation software. Nevertheless, by virtue of the measurement-independent monitoring of the current, an overcurrent does not lead to a total failure of the electronics, because the disruptive power current can be turned off beforehand.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
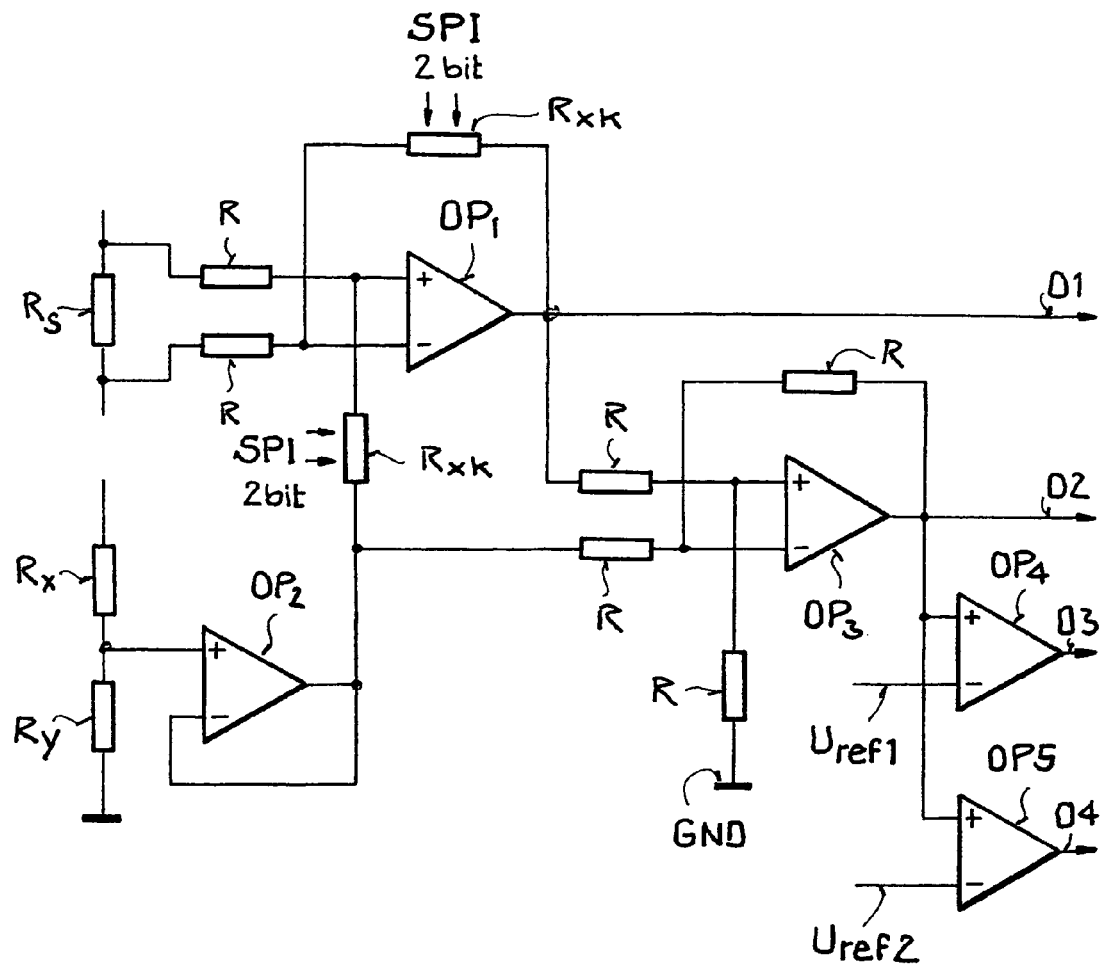
FIG. 1 illustrates a section of a circuit diagram with a circuit for current measurement and current monitoring.

The circuit diagram section shown in FIG. 1 can be integrated into, for example, any complete circuit diagram. Preferably, it is planned here that the circuit plan elements, shown in FIG. 1, with an arithmetic unit, for example, a microcontroller, not shown in FIG. 1, are integrated on a semiconductor chip. The technology used for this purpose is described, for example, as intelligent power electronics (smart power).

FIG. 1 shows a measuring resistor $R_s$, which is also called a shunt resistor. This measuring resistor $R_s$ is designed to measure currents, as are normally required to operate functional units of motor vehicles or parts thereof. The currents in this regard can be measured and monitored at voltages of the on-board network, for example, of the prior 12V on-board networks, but especially preferably in 42V on-board networks. A first differential amplifier $Op_1$ of the circuit section of FIG. 1 is connected for this purpose to several resistors R and R×k as a first subtractor circuit, which supplies the potential difference, forming due to the current flow across the measuring resistor $R_s$, between the contacts of the measuring resistor $R_s$ as output voltage to output $O_1$. The output voltage at output $O_1$ is connected to an analog/digital converter and to an arithmetic unit, connected to the analog/digital converter (not shown in FIG. 1), to evaluate the continuously determined measured values of the measured current.

Figure 2A:
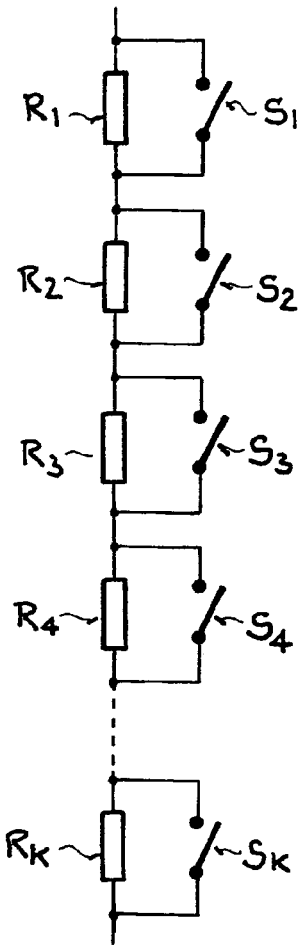
FIG. 2a illustrates a section of a circuit diagram of a first switchable resistor network.
Figure 2B:
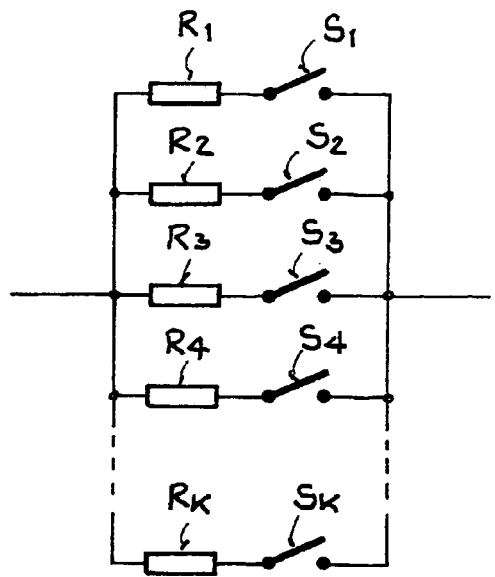
FIG. 2b illustrates a section of a circuit diagram of a second switchable resistor network.
Figure 2C:
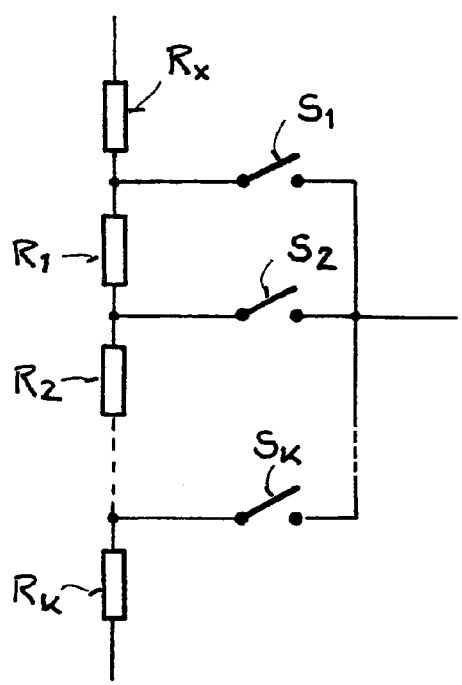
FIG. 2c illustrates a section of a circuit diagram of a third switchable resistor network.

By changing the resistors R×k, a voltage amplification through $Op_1$ can be set. The resistors can be changed, for example, by a serial 2-bit interface SPI. For this purpose, the relevant information is loaded into a register, not shown in FIG. 1, whereby the outputs of the register control single switching transistors. Possible alternative designs of the resistors R×k are shown in FIGS. 2a and 2b as resistor networks. Each network here comprises several resistors $R_1$, $R_2$, $R_3$, $R_4$ to $R_k$, with a switching element $S_1$, $S_2$, $S_3$, $S_4$ to $S_k$ assigned to each of them. These switching elements $S_1$, $S_2$, $S_3$, $S_4$ to $S_k$ are preferably the aforementioned switching transistors, for example, MOSFET transistors. FIG. 2a shows a series connection of the resistors $R_1$, $R_2$, $R_3$, $R_4$ to $R_k$, whereas FIG. 2b shows a parallel connection of the resistors $R_1$, $R_2$, $R_3$, $R_4$ to $R_k$. Another option for realizing the voltage divider from resistors $R_x$ and $R_y$ is shown in FIG. 2c. In FIG. 2c, the resistors $R_1$ to $R_k$ with resistor $R_x$ form a voltage divider, whereby different voltage values of the voltage divider can be selected by, for example, the switching elements $S_1$ to $S_k$. If the resistors $R_1$ to $R_k$ form the resistor $R_y$ of the FIG. 1, different voltages can be connected to the positive input of operational amplifier $Op_2$. In this case as well, one or more switching elements $S_1$ to $S_k$ can be selected via a serial 2-bit SPI interface (not shown in FIG. 2c).

The circuit section of FIG. 1 shows, in addition to the first subtractor, an offset circuit, which includes a second differential amplifier $Op_2$ and the resistors $R_x$ and $R_y$. The second differential amplifier $Op_2$ thus provides, as a low resistance, an offset voltage at its output, whereby the output of the second differential amplifier $Op_2$ is connected to a resistor R×k of the first subtractor circuit. The output voltage of the first subtractor circuit is $$U_{O1}=I_M*R_S*k+U_{offset}$$

The offset voltage can be set by the two resistors $R_x$ and $R_y$ connected as a voltage divider between the supply voltage VCC and ground. The offset voltage $U_{offset}$ is calculated in this exemplary embodiment by $$U_{offset}=VCC*R_y/(R_x+R_y)$$

Therefore, only this first differential amplifier $Op_1$ is designed for a large direct voltage range (common mode range), whereas the following stages should be designed only for small positive voltages. The setting of at least one of the resistors $R_x$ and $R_y$ occurs advantageously here by, for example, the switchable resistor networks already described in FIGS. 2a and 2b.

Furthermore, in FIG. 1, a second subtractor circuit is provided, which has the differential amplifier $Op_3$ and several resistors R. The second subtractor circuit is connected with its positive input to the output of the first subtractor circuit, whereas the negative input of the second subtractor circuit is connected to the output of the offset circuit. The offset circuit here enables both a chip-internal and a chip-external setting of the offset voltage. It is possible, via the offset voltage, to measure and monitor currents independent of the direction of the current flow across the measuring resistor $R_S$.

The connection of the offset circuit has the effect that the output voltage of the second subtractor is formed from the output voltage of the first subtractor minus the offset voltage present in the output voltage of the first subtractor. Therefore $$U_{O2}=I_M*R_S*k$$

The output voltage of the second subtractor circuit is thereby independent of the setting of the offset voltage and proportional to the measuring voltage measured at the measuring resistor $R_S$. The output of the second subtractor circuit is connected to output $O_2$, which enables other connections to other analogous circuits, for example, to a regulating circuit for regulating a desired current.

The fourth differential amplifier $Op_4$ and the fifth differential amplifier $Op_5$ serve as comparators, which compare a first and second reference voltage $U_{ref1}$ and/or $U_{ref2}$, each related to ground, with the output voltage of the second subtractor circuit. The output of the fourth differential amplifier $Op_4$ is thereby connected to output $O_3$, and the fifth differential amplifier $Op_5$ to output $O_4$. The output voltages of the fourth and/or fifth differential amplifier $Op_4$, $Op_5$ are used as digital output signals for the rapid control of the functional unit of the motor vehicle in that these are connected, for example, to switching performance transistors (not shown in FIG. 1), which enable a shutting off of the short-circuit current. Of course, the circuit diagram section, shown in FIG. 1, can also be arranged several times in parallel, for example, to measure and monitor several different currents.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A circuit for current measurement and current monitoring, the circuit comprising:
   a measuring circuit having a first subtractor circuit being connected to a measuring resistor;
   an offset circuit being connected to an input of the first subtractor circuit so that a first output voltage of the first subtractor circuit is increased by an offset voltage;
   a second subtractor circuit being connected to the offset circuit and the first subtractor circuit so that a second output voltage of the second subtractor circuit is substantially independent of the offset voltage; and
   a comparator circuit having at least one switching threshold, which is connected to the second subtractor circuit for comparing the second output voltage with the at least one switching threshold.

2. The circuit according to claim 1, wherein the offset voltage of the offset circuit can be adjustable.

3. The circuit according to claim 2, wherein the offset circuit for adjusting the offset voltage includes a voltage divider.

4. The circuit according to claim 1, wherein the measuring circuit measures bidirectional current.

5. The circuit according to claim 1, wherein the measuring circuit is designed so that an amplification of the first subtractor circuit is settable.

6. The circuit according to claim 5, wherein to set the amplification, resistors of the first subtractor circuit are switchable.

7. The circuit according to claim 1, wherein the comparator circuit has a window discriminator.

8. The circuit according to claim 1, wherein the measuring circuit, the offset circuit, the second subtractor circuit, and the comparator circuit are integrated on a single semiconductor chip.

9. The circuit according to claim 1, wherein the circuit measures current and monitors current of a load current of a load of a functional unit of a motor vehicle.

10. The circuit according to claim 3, wherein the voltage divider is formed of switchable resistors.

11. A method for monitoring and measuring current, the method comprising the steps of:
    increasing a first output voltage of a first subtractor circuit by an offset voltage, which is provided by an offset circuit being connected to an input of the first subtractor circuit;
    subtracting the offset voltage from the first output voltage to provide a second output voltage; and
    comparing the second output voltage to a reference voltage to provide a digital output signal,
    wherein the first output voltage is utilized to monitor and measure the current, and
    wherein the digital output signal is utilized for rapid control of a functional unit of a motor vehicle.

12. The method according to claim 11, wherein the offset circuit includes at least one switchable resistor for changing a value of the offset voltage.

13. The method according to claim 11, wherein the offset circuit includes a plurality of switchable resistors for changing a value of the offset voltage.

14. The method according to claim 13, wherein the plurality of switchable resistors are provided in series.

15. The method according to claim 13, wherein the plurality of switchable resistors are provided in parallel.

* * * * *